(12) United States Patent
Colnat (10) Patent No.: US 8,754,505 B2
(45) Date of Patent: Jun. 17, 2014

(54) METHOD OF PRODUCING A HETEROSTRUCTURE WITH LOCAL ADAPTATION OF THE THERMAL EXPANSION COEFFICIENT

(75) Inventor: Cyrille Colnat, Saint Martin d'Heres (FR)

(73) Assignee: Soitec, Bernin (FR)

( * ) Notice: Subject to any disclaimer, the term of this patent is extended or adjusted under 35 U.S.C. 154(b) by 292 days.

(21) Appl. No.: 13/148,353

(22) PCT Filed: Dec. 24, 2009

(86) PCT No.: PCT/EP2009/067919
§ 371 (c)(1),
(2), (4) Date: Aug. 8, 2011

(87) PCT Pub. No.: WO2010/102686
PCT Pub. Date: Sep. 16, 2010

(65) Prior Publication Data
US 2012/0018855 A1    Jan. 26, 2012

(30) Foreign Application Priority Data
Mar. 9, 2009   (FR) ...................... 09 51452

(51) Int. Cl.
*H01L 23/544* (2006.01)
*H01L 21/30* (2006.01)
*H01L 21/46* (2006.01)

(52) U.S. Cl.
USPC ............ 257/620; 257/506; 438/424; 438/455

(58) Field of Classification Search
None
See application file for complete search history.

(56) References Cited

U.S. PATENT DOCUMENTS

| 5,091,330 | A  | * | 2/1992  | Cambou et al. ............... 438/406 |
| 5,346,848 | A  | * | 9/1994  | Grupen-Shemansky et al. .............................. 438/406 |
| 6,858,517 | B2 |   | 2/2005  | Martinez et al. .............. 438/455 |
| 6,991,944 | B2 |   | 1/2006  | Rayssac et al. .................. 438/13 |
| 7,067,393 | B2 |   | 6/2006  | Letertre et al. |
| 7,253,082 | B2 | * | 8/2007  | Adachi et al. ................. 438/459 |
| 7,387,944 | B2 | * | 6/2008  | Tong et al. .................... 438/455 |
| 2004/0241902 | A1 |   | 12/2004 | Letertre et al. ................ 438/106 |
| 2004/0253795 | A1 |   | 12/2004 | Martinez et al. .............. 438/459 |
| 2005/0006740 | A1 |   | 1/2005  | Letertre et al. |
| 2005/0130393 | A1 |   | 6/2005  | Blondeau et al. ............. 438/479 |
| 2006/0076649 | A1 |   | 4/2006  | Letertre et al. ................ 257/619 |
| 2007/0020947 | A1 | * | 1/2007  | Daval et al. ................... 438/758 |
| 2008/0070340 | A1 |   | 3/2008  | Borrelli et al. .................. 438/57 |
| 2008/0315336 | A1 |   | 12/2008 | Ravindra et al. ............. 257/421 |

FOREIGN PATENT DOCUMENTS

EP    1 487 012 A2   12/2004
EP    1 542 275 A1    6/2005
(Continued)

OTHER PUBLICATIONS

International Search Report, PCT/EP2009/067919, mailed Feb. 22, 2010.

*Primary Examiner* — Andres Munoz
(74) *Attorney, Agent, or Firm* — TraskBritt (57) ABSTRACT

A method of producing a heterostructure by bonding at least one first substrate having a first thermal expansion coefficient onto a second substrate having a second thermal expansion coefficient, with the first thermal expansion coefficient being different from the second thermal expansion coefficient. Prior to bonding, trenches are formed in one of the two substrates from the bonding surface of the substrate. The trenches are filled with a material having a third thermal expansion coefficient lying between the first and second thermal expansion coefficients.

18 Claims, 4 Drawing Sheets

(56) References Cited

FOREIGN PATENT DOCUMENTS

| FI | 2855650 A | 12/2004 |
| JP | 61-182215 | 8/1986 |
| JP | 2007-527108 | 9/2007 |
| WO | WO 2008/033508 A2 | 3/2008 |

* cited by examiner

METHOD OF PRODUCING A HETEROSTRUCTURE WITH LOCAL ADAPTATION OF THE THERMAL EXPANSION COEFFICIENT

This application is a 371 filing of International Patent Application PCT/EP2009/067919 filed Dec. 24, 2009.

TECHNICAL FIELD AND PRIOR ART

The present invention relates to producing heterogeneous structures formed by bonding at least one first substrate having a first thermal expansion coefficient to a second substrate having a second thermal expansion coefficient that is different from the first thermal expansion coefficient. The heterostructures are used in microelectronics or in optoelectronics in particular.

When assembling two substrates with different thermal expansion coefficients, for example, differing by at least 10% or 20% at ambient temperature (20° C.), or during any subsequent treatment of the two assembled substrates, temperature rise stages may take place, for example, to reinforce the bonding interface.

During rises in temperature, variations in the behavior of one of the two substrates relative to the other generate stresses and/or deformations in the heterostructure that increase the defectivity thereof and reduce the quality of the bond between the substrates. Furthermore, such stresses may result in at least one of the two substrates breaking by a stress relaxation phenomenon once the temperature reaches a few hundred degrees (for example, a temperature in the range 200° C. to 600° C.).

In general, because of difference in the thermal expansion coefficients, variations in temperature, for example, from 200° C. and above, may cause strains, but may also cause delamination or splitting of the substrates or layers that are present, and/or plastic deformations and/or fractures and/or breakage of one or more substrates or layers that are present.

As a consequence, the problem arises of finding a method that can avoid such effects in such a heterostructure during rises in temperature.

U.S. Pat. No. 6,858,517 describes a method of producing a heterostructure by assembling a first and a second substrate having different respective thermal expansion coefficients. In order to reduce the deformations and strains generated by the difference in thermal expansion coefficients between the first and second substrates, that document teaches bonding a third substrate onto one of the two substrates, which third substrate is formed from a material that is identical to one of the two substrates or has a thermal expansion coefficient that is close thereto.

Further, U.S. Pat. No. 7,067,393 describes the production of a heterogeneous structure formed by assembling two substrates having different thermal expansion coefficients, wherein motifs having an elasticity in the plane of assembly of the substrates are produced on one of the two substrates in order to absorb thermoelastic strains in the assembly during temperature rises.

SUMMARY OF THE INVENTION

One of the aims of the invention is to overcome the above-mentioned disadvantages by proposing a solution that means that a heterostructure can be produced that has been designed in order to reduce the strains and/or deformations within it during heat treatments.

To this end, the present invention proposes a method of producing a heterostructure, comprising bonding at least one first substrate having a first thermal expansion coefficient onto a second substrate having a second thermal expansion coefficient, the first thermal expansion coefficient being different from the second thermal expansion coefficient, in which method, prior to bonding, trenches are formed in at least one of the two substrates from the bonding surface of the substrate and the trenches are filled with a material having a third thermal expansion coefficient lying between the first and second thermal expansion coefficients.

Thus, because of the presence in the trenches of a material having a thermal expansion coefficient lying between those of the first and second bonded substrates, the thermal expansion coefficient in the structure is matched at least locally at the bonding interface between the two substrates. In this region, each substrate including such a material at its bonding surface has a mean thermal expansion coefficient that is closer to that of the other substrate, and as a result is better matched. This thereby significantly reduces the deformations and/or strains normally observed between the two bonded substrates during heat treatments.

The heterostructure produced in accordance with the method of the invention may then undergo high-temperature heat treatments that can in particular increase and render uniform the bonding energy between the two substrates. The trenches can also reduce the defectivity in the heterostructure by trapping elements that are the sources of defects. In particular, the trenches can trap bubbles at the bonding interface between the two substrates.

The first substrate may in particular be formed from a material selected from at least silicon, germanium (thermal expansion coefficient of approximately $5.8 \times 10^{-6}.K^{-1}$), gallium arsenide (AsGa, thermal expansion coefficient of approximately $5.8 \times 10^{-6}.K^{-1}$), and gallium nitride (GaN), while the second substrate may in particular be formed from a material selected from at least sapphire, a borosilicate glass (thermal expansion coefficient of approximately $3.3 \times 10^{-6}.K^{-1}$), and silicon.

In accordance with a particular implementation of the method of the invention, the trenches are produced both in the first and in the second substrates from their bonding surface, the trenches being filled with the material having said third thermal expansion coefficient. In this configuration, the trenches formed in the first substrate are preferably aligned, in a direction perpendicular to the plane of the substrate, with the trenches formed in the second substrate when the two substrates are bonded.

In accordance with one aspect of the invention, components are formed on at least one of the first and second substrates. Under such circumstances, the trenches are preferably produced in predetermined zones that are a function of the positioning of components and in particular in zones intended to separate said components, such as zones corresponding to cutting lines, for example.

The present invention also provides a heterostructure comprising at least one first substrate having a first thermal expansion coefficient bonded to a second substrate having a second thermal expansion coefficient, the first thermal expansion coefficient being different from the second thermal expansion coefficient, the heterostructure being characterized in that at least one of the two substrates includes trenches in its bonding surface with the other substrate and in that the trenches contain a material having a third thermal expansion coefficient lying between the first and second thermal expansion coefficients.

The first substrate may in particular be formed from a material selected from at least silicon, germanium, gallium arsenide and gallium nitride (GaN), while the second substrate may in particular by formed from a material selected from at least sapphire, a borosilicate glass, and silicon.

In a particular embodiment, both the first and the second substrates include respective trenches in their bonding surfaces, the trenches containing the material having the third thermal expansion coefficient. The trenches of the first substrate are preferably aligned with the trenches of the second substrate.

In a further particular embodiment, at least one of the first and second substrates includes components. The components may be disposed in zones defined by the trenches.

BRIEF DESCRIPTION OF THE FIGURES

Other characteristics and advantages of the invention become apparent from the following description of particular implementations of the invention, given by way of non-limiting example made with reference to the accompanying drawings in which.

DETAILED DESCRIPTION OF IMPLEMENTATIONS OF THE INVENTION

The method of the present invention is of general application to the production of heterostructures formed by assembling at least one first substrate with a second substrate, the substrates having different thermal expansion coefficients.

The method of the invention proposes producing trenches in at least one of the two substrates to be assembled together, the trenches being produced in the bonding face of the substrate and being filled with a material that has a thermal expansion coefficient lying between those of the two substrates.

Each substrate may be constituted by a mono-layered structure (a single material) that may include motifs and/or components, or a multi-layered structure (stack of layers of different materials). With a multi-layered structure, it is the thermal expansion coefficient of the material of the layer that is closest to the bonding interface that is taken into account in selecting the thermal expansion coefficient of the material filling the trenches.

By way of non-limiting example, the method of the invention is of particular application to the production of heterostructures formed by assembling together two substrates respectively constituted, for example, by sapphire and silicon, or by gallium nitride and silicon.

In general, the method of the invention is advantageously applicable to assembling together two substrates with a thermal expansion coefficient difference of 10% or more (relative to the lower thermal expansion coefficient).

Figure 1A:
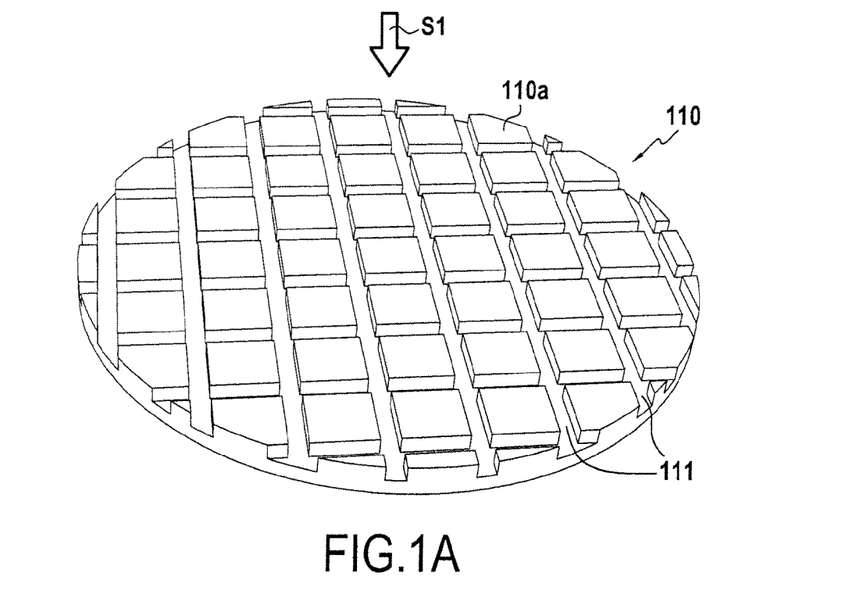
FIGS. 1A to 1F are diagrammatic views showing the production of a heterostructure employing a method of the invention.
Figure 1B:
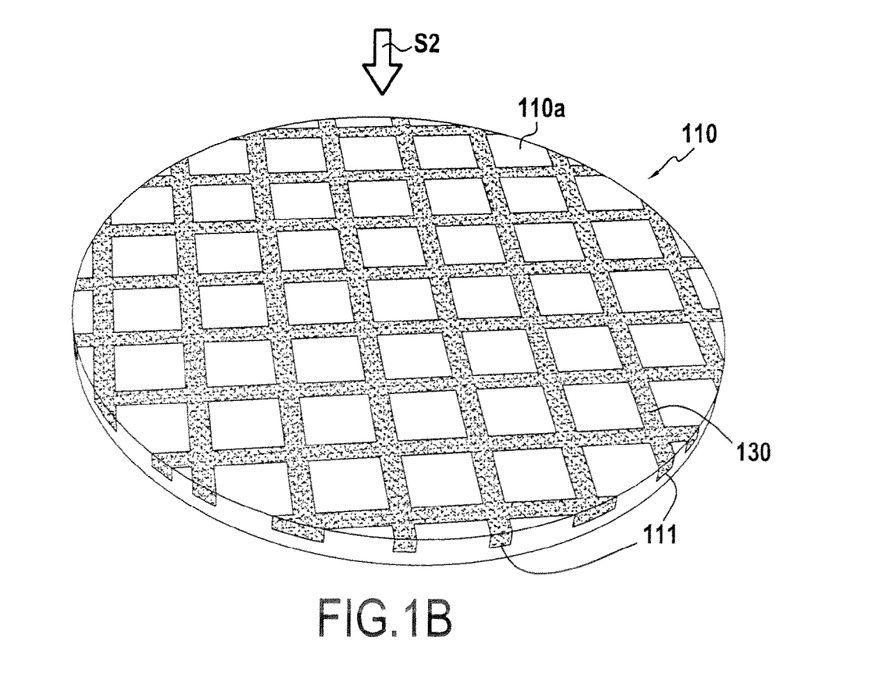
Figure 1C:
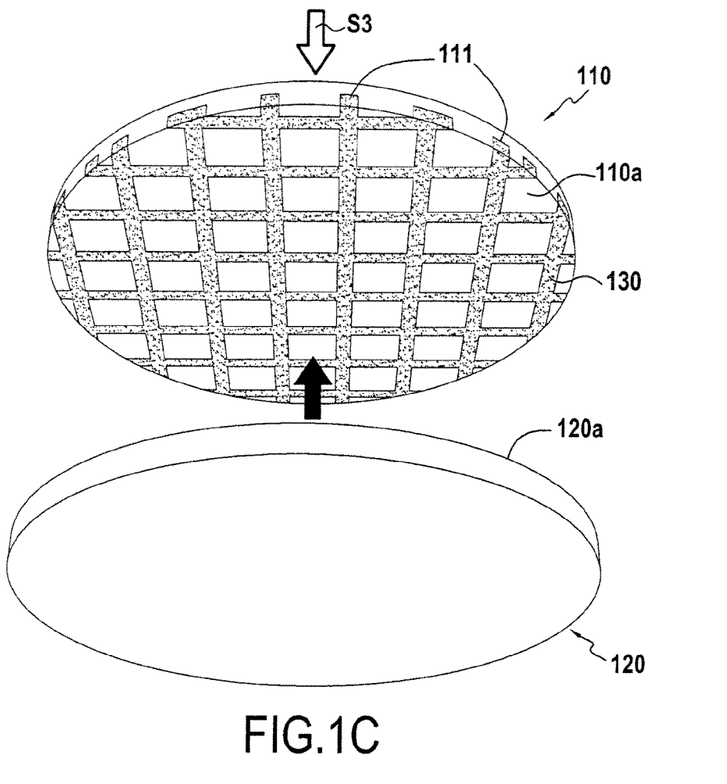
Figure 1D:
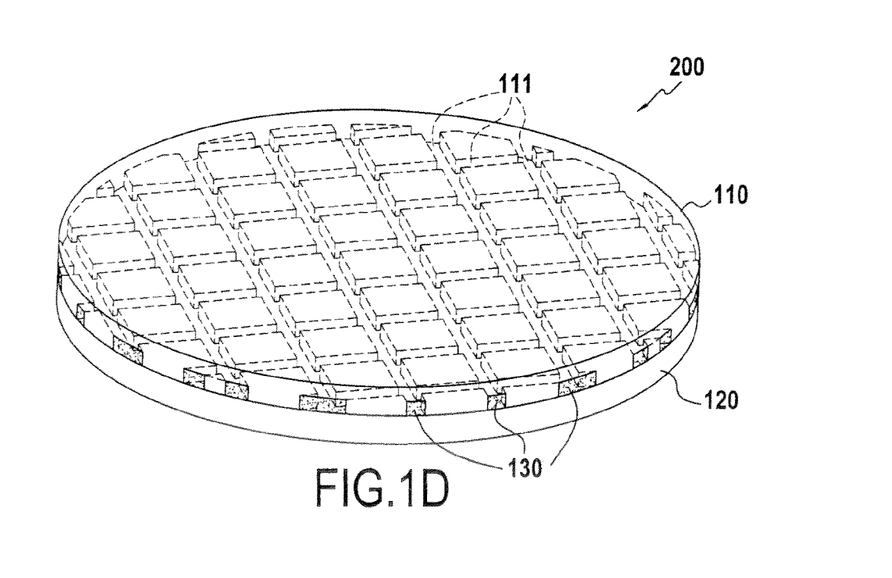
Figure 1E:
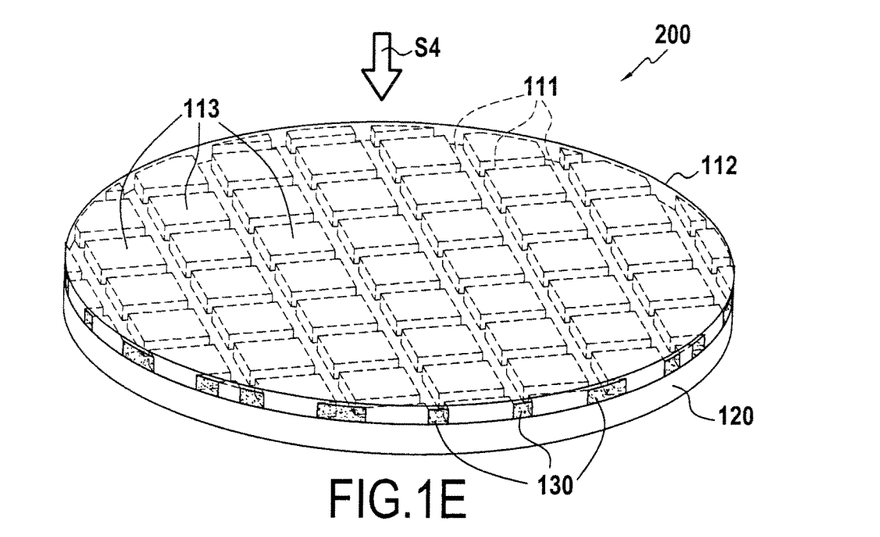
Figure 1F:
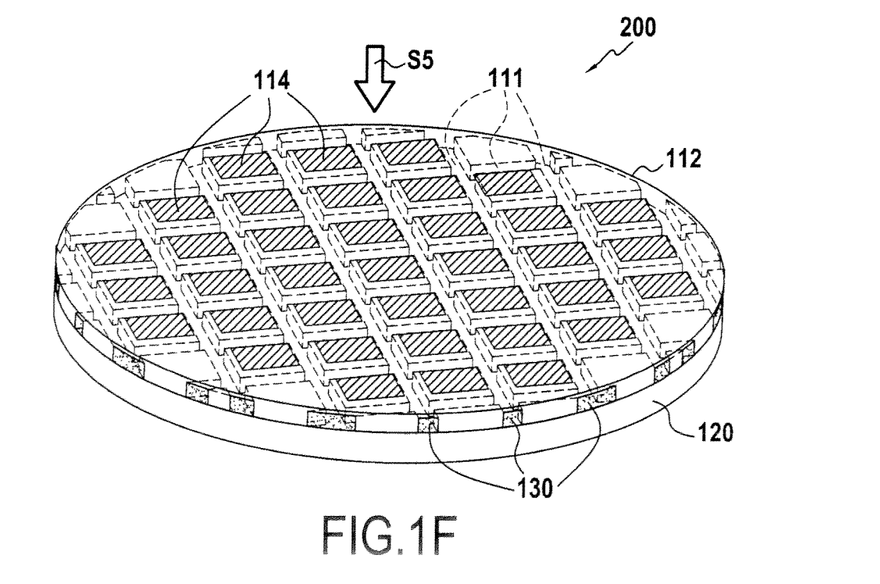
Figure 2:
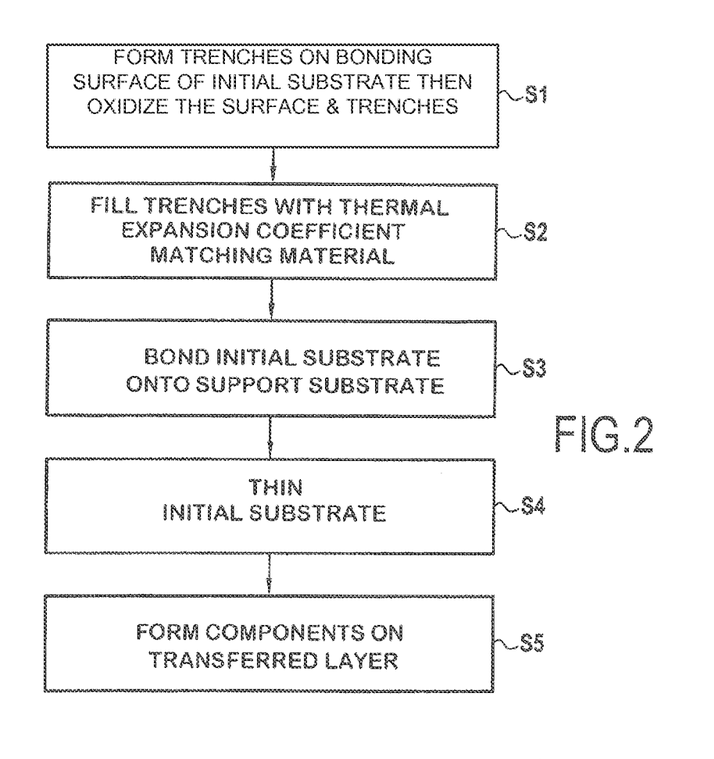
FIG. 2 is a flow chart of the steps carried out during production of the heterostructure shown in FIGS. 1A to 1F.

With reference to FIGS. 1A-2, a method is described for producing a SOS (silicon on sapphire) type heterostructure from an initial substrate 110 (top) of silicon and a support substrate 120 (base) of sapphire ($Al_2O_3$). The substrates are wafers that may in particular have diameters of 150 mm, 200 mm and 300 mm.

In accordance with the invention, trenches or grooves 111 are formed in the substrate 110 from its surface 110a that is intended to be brought into contact with the support substrate during assembly (step S1, FIG. 1A). The trenches 111 may be formed by chemical dry etching, photolithography, or any other suitable technique.

In the example described here, the initial substrate 110 is a silicon mono-layer structure. However, the substrate 110 may also be constituted by a multilayer structure such as a SOI (silicon on insulator) type structure comprising a layer of silicon on a support, also of silicon, a buried oxide layer, for example, formed from $SiO_2$, being disposed between the layer and the silicon support.

Once the trenches 111 have been produced, they are filled with a material 130 (step S2, FIG. 1B) with a thermal expansion coefficient that lies between that of silicon and that of sapphire, thereby constituting a thermal expansion coefficient adaptation material. More precisely, a material 130 is selected that has a thermal expansion coefficient of less than $5 \times 10^{-6}/°$ C. (thermal expansion coefficient of sapphire) and more than $3.6 \times 10^{-6}/°$ C. (thermal expansion coefficient of silicon). The material 130 may in particular be selected from silicon-germanium (SiGe), germanium, a nitride such as silicon nitride ($Si_3N_4$), and an oxide such as BPSG (borophosphosilicate glass).

In particular, the trenches may be filled by deposition over the whole of the surface of the substrate, for example, by plasma enhanced chemical vapor deposition (PEVCD). Under such circumstances, the material is deposited in the trenches, but also in excess over the portions of the substrate located between the trenches, creating a surface topology. Planarization (polishing) is then carried out over the surface of the substrate in order to remove the topology and prepare the substrate surface for bonding. The planarization may be selective, i.e., removal of the material may be stopped when the material deposited in excess is withdrawn completely and the planarization pad comes into contact with the subjacent portions of material of the substrate located between the trenches.

The trenches may be oxidized prior to being filled with the material 130.

The initial substrate 110 is then assembled with the support substrate 120 by direct wafer bonding or by using other techniques (for example, using adhesives) (step S3, FIG. 1C).

With direct wafer bonding, surfaces 110a and 120a, respectively of the substrates 110 and 120, are brought into intimate contact and pressure is applied to one of the two substrates in order to initiate propagation of a bonding wave between the surfaces in contact.

As is well known per se, the principle of direct wafer bonding, also known as direct bonding, is based on bringing two surfaces into direct contact, i.e., without using a specific material (adhesive, wax, solder, etc.). Such an operation requires that the surfaces to be bonded be sufficiently smooth, free of particles or contamination, and that they come sufficiently close to allow contact to be initiated, typically to a distance of less than a few nanometers. The attractive forces between the two surfaces are then high enough to cause molecular adhesion (bonding induced by the ensemble of the attractive forces (Van der Waals forces) due to electronic interaction between atoms or molecules of the two surfaces to be bonded).

Before carrying out bonding of the initial substrate 110 to the support substrate 120, the bonding surface 120a of the sapphire support substrate that has been polished, typically by CMP polishing, may be prepared. This preparation may in particular consist in chemical cleaning especially, for example, by a RCA clean or a Caro's type clean or Piranhaclean type clean ($H_2SO_4:H_2O_2$). Cleaning may be followed by scrubbing.

In order to increase the bonding energy further, the surface 120a of the substrate 120 may be activated using a plasma treatment.

The surface 110a of the initial substrate 110 may be covered with a layer of thermal oxide formed, for example, by oxidizing the surface of the substrate The surface 110a of the initial substrate 110, which may optionally be covered with a layer of oxide, may also be activated by plasma treatment. The bonding surfaces of the substrates 110 and 120 may be activated by exposing them to a plasma based on oxygen, nitrogen, argon, or other. Activation of a bonding surface by plasma treatment is well known to the skilled person and is not described here in more detail for the purposes of simplification.

Once the substrates 110 and 120 have been assembled one against the other, a heterostructure 200 is obtained comprising a network of buried trenches 111 filled with material 130 (FIG. 1D). Because of the presence of the material 130 in the initial substrate 110 at its bonding surface with the support substrate 120 close to the bonding interface, the initial substrate 110 has a local mean thermal expansion coefficient that is higher than that of silicon and, as a consequence, closer to that of the sapphire constituting the support substrate 120. This local matching of the thermal expansion coefficient means that thermoelastic stresses and differential expansion that are normally generated during rises in temperature between two materials with different thermal expansion coefficients can be reduced.

In the example described here, production of a heterostructure is continued by thinning the initial substrate 110 in order to form a transferred layer 112 corresponding to a portion of the initial substrate (step S4, FIG. 1E). The substrate may be thinned using any known technique such as dry etching (reactive ionic etching), also termed plasma etching, and/or wet etching (chemical etching using, for example, a TMAH solution for silicon), mechanical polishing (grinding), chemical-mechanical polishing (CMP) (a well known polishing technique using a pad associated with a polishing solution), or the well-known SMART CUT® technique (implanting ions in the substrate to form a zone of weakness along which the substrate is fractured).

Before thinning the initial substrate 110, the bond or, more particularly, the bonding energy, may be reinforced by a bonding stabilization anneal. Because of the local matching of the thermal expansion coefficients as described above, this anneal may be carried out at high temperatures, which means that a high bonding energy between the substrates can be obtained.

In accordance with one aspect of the invention, the heterostructure 200 may be used to produce components. Under such circumstances, microcomponents 114 (forming all or a portion of an electronic, optoelectronic etc. component, or a plurality of electronic microcomponents such as circuits or contacts or active layers) are formed on the transferred layer 112 (step S5, FIG. 1F). The microcomponents 114 are formed by photolithography using a mask that can define motif formation zones corresponding to the microcomponents 114 to be produced.

When components or other elements (motifs, materials, etc.) are to be formed on the heterostructure of the invention, the trenches are preferably produced in sacrificial portions of the layer 120 that are determined as a function of the intended positioning of the components (overall pattern of the photolithography). These sacrificial portions act in particular to define useful zones 113 of the layer, i.e., the zones 113 in which it is intended to form the components or circuits. The sacrificial portions correspond in particular to regions separating the components or circuits and/or cutting lines. As can be seen in FIG. 1E, the trenches 111 have been produced so as to define the zones 113 in which it is intended to produce the microcomponents 114. Thus, the components are formed in portions of the layer 120 that comprise silicon alone (in the direction of the thickness of the layer 120). Each microcomponent 114 may, for example, be removed by cutting along the trenches 111.

The trenches can also reduce the defectivity in the heterostructure by trapping elements that are the sources of defects. In particular, the trenches can trap bubbles at the bonding interface between the two substrates. When the trenches are produced in the sacrificial portions of the substrate as described above, the bubbles are then trapped in zones beyond the useful zones of the substrate, i.e., the zones in which microcomponents are intended to be produced.

Figure 3:
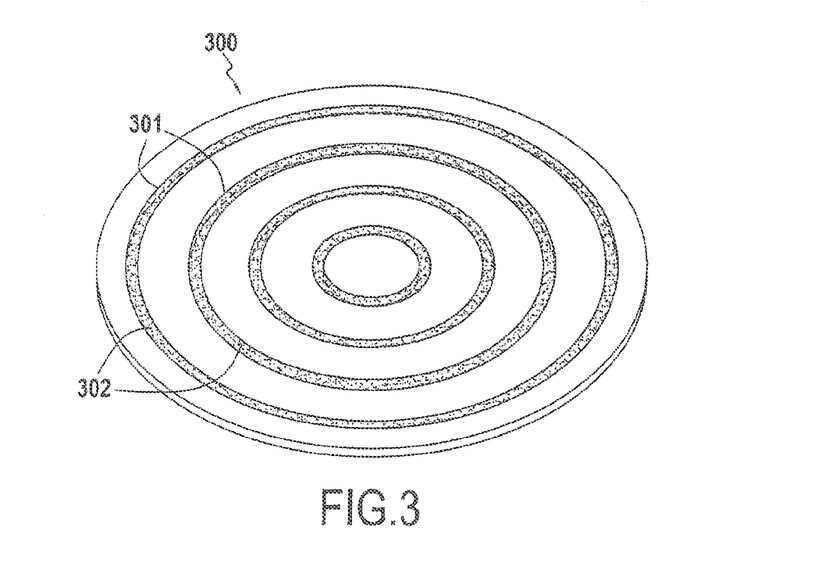
FIG. 3 shows another configuration of trenches in the bonding surface of a substrate in an embodiment of the invention.

The shape, width, depth, and number of the trenches are variable, and they are determined in particular as a function of the mean thermal expansion coefficient that is to be obtained in the neighborhood of the bonding interface. FIG. 3 illustrates a variation in which a substrate 300, for assembly with another substrate having a different thermal expansion coefficient, includes concentric trenches 301. These trenches are filled with a material 302 having a thermal expansion coefficient that lies between those of the two substrates.

The trenches may be formed and filled in the bonding surface of one or both substrates. When the trenches are present in both substrates, they are preferably produced so that the trenches formed in the first substrate are aligned with the trenches formed in the second substrate when the two substrates are assembled together. With trenches present in both substrates, the trenches formed in the first substrate may be filled with a first material and the trenches formed in the second substrate may be filled with a second material that is different from the first, the first and second filling materials having respective thermal expansion coefficients that lie between those of the two substrates.

What is claimed is:

1. A method of producing a heterostructure that comprises bonding a bonding surface of at least one first substrate having a first thermal expansion coefficient directly onto a bonding surface of a second substrate having a second thermal expansion coefficient, with the first thermal expansion coefficient being different from the second thermal expansion coefficient, the method further comprising, prior to bonding:
   forming trenches in the bonding surfaces of both the first and second substrates;
   filling the formed trenches with a filling material having a third thermal expansion coefficient that has a value that is between the first and second thermal expansion coefficients in order to reduce deformations or strains that would otherwise be observed during heat treatments of bonded substrates that do not include such filled trenches with the filling material also deposited over the bonding surfaces of the first and second substrates; and
   planarizing the filling material to bonding to remove the filling material from the bonding surfaces but not from the trenches.

2. The method according to claim 1, wherein the first substrate is made of a material having a thermal expansion coefficient of at least $5 \times 10^{-6}/°$ C., the second substrate is made of a material having a thermal expansion coefficient of $3.6\times10^{-6}/°$ C. or less and the material filling the trenches has a thermal expansion coefficient of less than $5\times10^{-6}/°$ C. and greater than $3.6\times10^{-6}/°$ C.

3. The method according to claim 1, wherein the first substrate is formed from silicon, germanium, gallium arsenide or gallium nitride and the second substrate is formed from sapphire, a borosilicate glass, or silicon.

4. The method according to claim 1, wherein the filling material is silicon-germanium, germanium, a silicon nitride, or a borophosphosilicate glass.

5. The method according to claim 1, wherein the trenches of the first substrate are aligned with the trenches of the second substrate when the first and second substrates are bonded.

6. The method according to claim 1, wherein microcomponents are present on at least one of the first and second substrates.

7. The method according to claim 6, wherein the trenches are produced in predetermined zones such that the trenches are adjacent the microcomponents.

8. The method according to claim 1, which further comprises oxidizing one or both of the bonding surfaces including the trenches prior to filling the trenches and bonding the first and second substrates.

9. The method according to claim 1, which further comprises cleaning and activating one or both of the bonding surfaces prior to bonding the first and second substrates.

10. The method according to claim 1, wherein the filling material in the trenches of the first substrate has a fourth thermal expansion coefficient that has a value that is between the first and second thermal expansion coefficients and is different from the filling material in the trenches of the second substrate.

11. A method of reducing deformations or strains in bonded substrates during heat treatments, which comprises:
   prior to bonding, forming trenches in a bonding surface of each of first and second substrates that are to be bonded together, wherein the first substrate has a first thermal expansion coefficient and the second substrate has a second thermal expansion coefficient, with the first thermal expansion coefficient being different from the second thermal expansion coefficient;
   filling the formed trenches with a filling material having a third thermal expansion coefficient that has a value that is between the first and second thermal expansion coefficients with the filling material also deposited over the bonding surfaces of the first and second substrates;
   bonding the surface of the first substrate onto the bonding surface of the second substrate in order to reduce deformations or strains that would otherwise be observed during heat treatments of bonded substrates that do not include such filled trenches; and
   planarizing the filling material prior to bonding to remove the filling material from the bonding surfaces but not from the trenches.

12. The method according to claim 11, wherein the filling material in the trenches of the first substrate has a fourth thermal expansion coefficient that has a value that is between the first and second thermal expansion coefficients and is different from the filling material in the trenches of the second substrate.

13. A heterostructure comprising at least one first substrate having a first thermal expansion coefficient bonded to a second substrate having a second thermal expansion coefficient, with the first thermal expansion coefficient being different from the second thermal expansion coefficient, wherein each of the first and second substrates includes a bonding surface with trenches therein and the trenches contain a filling material having a third thermal expansion coefficient that has a value that is between the first and second thermal expansion coefficients.

14. The heterostructure according to claim 13, wherein the first substrate is formed of silicon, germanium, gallium arsenide or gallium nitride and the second substrate is formed of sapphire, a borosilicate glass, or silicon.

15. The heterostructure according to claim 13, wherein the trenches of the first substrate are aligned with the trenches of the second substrate.

16. The heterostructure according to claim 13, wherein one of the first and second substrates includes microcomponents.

17. The heterostructure according to claim 16, wherein the microcomponents are disposed in zones between the trenches.

18. The hetero structure according to claim 13, wherein the filling material in the trenches of the first substrate has a fourth thermal expansion coefficient that has a value that is between the first and second thermal expansion coefficients and is different from the filling material in the trenches of the second substrate.

* * * * *

UNITED STATES PATENT AND TRADEMARK OFFICE
CERTIFICATE OF CORRECTION

PATENT NO. : 8,754,505 B2  
APPLICATION NO. : 13/148353  
DATED : June 17, 2014  
INVENTOR(S) : Cyrille Colnat It is certified that error appears in the above-identified patent and that said Letters Patent is hereby corrected as shown below:

On the title page:
In ITEM (56) References Cited
    FOREIGN PATENT DOCUMENTS
    Page 2, 1st column, 1st line of the
        1st entry (line 5),         change "FI" to --FR--

In the claims:
CLAIM 2, COLUMN 7, LINE 1,     change "material filling the trenches" to --filling material--

CLAIM 11, COLUMN 8, LINE 3,     change "the surface" to --the bonding surface--

Signed and Sealed this
Fifteenth Day of September, 2015

Michelle K. Lee
*Director of the United States Patent and Trademark Office*